United States Patent [19]

Matsuoka et al.

[11] 4,439,706

[45] Mar. 27, 1984

[54] QUARTZ CRYSTAL VIBRATOR

[75] Inventors: Youichi Matsuoka, Sayama; Fumitaka Tajika, Iruma, both of Japan

[73] Assignee: Nihon Dempa Kogyo Company Limited, Tokyo, Japan

[21] Appl. No.: 318,403

[22] Filed: Nov. 5, 1981

[30] Foreign Application Priority Data

Oct. 11, 1980 [JP] Japan .......................... 55-160410[U]

[51] Int. Cl.³ ............................................. H01L 41/22
[52] U.S. Cl. .................................... 310/353; 310/348; 310/369
[58] Field of Search .............. 310/312, 342, 344, 348, 310/353, 361, 365, 366, 369

[56] References Cited

U.S. PATENT DOCUMENTS

| | | | |
|---|---|---|---|
| 2,440,064 | 4/1948 | Arnold et al. | 310/348 |
| 2,802,955 | 8/1957 | Kitterman | 310/348 |
| 2,933,628 | 4/1960 | Samuelson | 310/344 |
| 4,112,324 | 9/1978 | Yamaguchi et al. | 310/342 |
| 4,266,157 | 5/1981 | Peters | 310/353 |

FOREIGN PATENT DOCUMENTS

2612643 9/1977 Fed. Rep. of Germany ...... 310/353

OTHER PUBLICATIONS

Thompson, E. C., "Double Mount for Each Electrode of Crystal to Prevent Failure", Western Electric Technical Digest, No. 26, Apr. 1972.

Primary Examiner—J. D. Miller
Assistant Examiner—D. L. Rebsch
Attorney, Agent, or Firm—Staas & Halsey

[57] ABSTRACT

A quartz crystal vibrator has a vibrator element which includes a quartz crystal plate having obverse and reverse sides. A first excitation electrode is provided on the obverse side of the quartz crystal plate at the central portion thereof, and a first connecting electrode extends radially from the first excitation on the obverse side. A first supporting electrode is connected to the first connecting electrode and is provided fragmentarily along the entire circumference of the quartz crystal plate on the obverse side thereof. A second excitation electrode is provided on the reverse side of the quartz crystal plate at the central portion thereof at a position underlying the first excitation electrode, and a second connecting electrode extends radially from the second excitation electrode on the reverse side. A second supporting electrode is connected to the second connecting electrode and is provided fragmentarily over substantially all of a circular ring-like region located inwardly of the circumference of the quartz crystal plate on the reverse side, so as not to overlap the first supporting electrode. A first terminal pin is connected to the first supporting electrode at any point thereon, and a second terminal pin is connected to the second supporting electrode at any point thereon.

13 Claims, 14 Drawing Figures

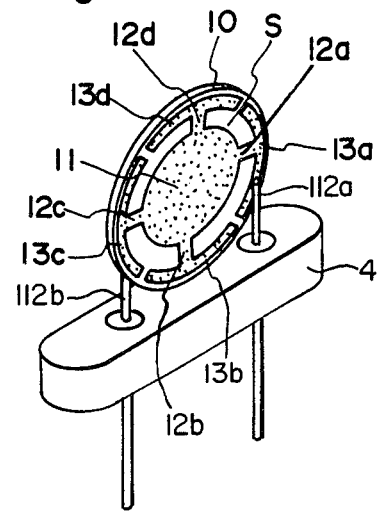
Fig.3(A)
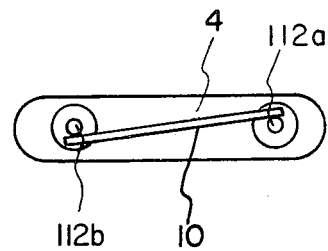
Fig.3(B)
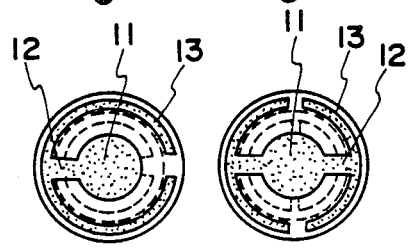  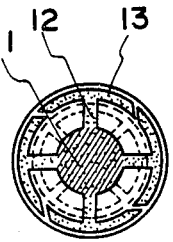
Fig.4  Fig.5  Fig.6  Fig.7
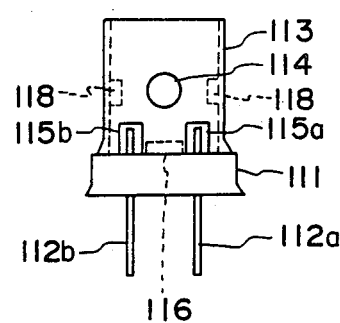
Fig.8
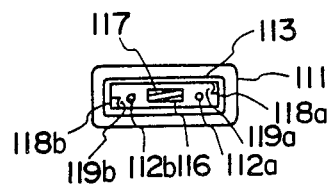
Fig.9

QUARTZ CRYSTAL VIBRATOR

BACKGROUND OF THE INVENTION

This invention relates to a quartz crystal vibrator and, more particularly, to a quartz crystal vibrator of the type in which a plate-shaped quartz crystal vibrator element, having electrodes formed thereon, is received in a holding case.

Quartz crystal vibrators deliver very stable oscillation frequencies and therefore are employed widely as oscillators to produce clock signals in computers or in electronic timepieces. According to the basic construction of quartz crystal vibrators of the foregoing type, a quartz crystal vibrator element, such as a circular plate-shaped AT-cut quartz crystal having electrodes formed on both sides thereof, is sealed hermetically in a metal holding case, with the electrodes of the vibrator being led out from the holding case by means of external terminal pins connected to the electrodes within the case. The method of manufacture is as follows. First, an AT-cut quartz crystal element which is circular or rectangular in shape, is prepared, and both sides of the crystal are polished. These sides may be polished to mirror surfaces if required. Next, each side of the crystal is provided with a circular or elliptical excitation electrode, as well as with a connecting conductor which is extended from the excitation electrode to the circumference of the crystal along the surface thereof. This furnishes the complete quartz crystal vibrator element. A metal base member is also provided. The base member is pierced by two external terminal pins which are hermetically and electrically insulated with respect to the base member. Next, the upper ends of the terminal pins are rounded into a ring-like configuration to form clips. The circumferential portions of the connecting conductors on both sides of the quartz crystal vibrator element are clamped between the clips, and an electrically conductive adhesive is applied to the portions where the clamping is effected. Thus, when the adhesive hardens, the quartz crystal vibrator element will be fixedly secured to the terminal pins. The quartz crystal vibrator element is then covered with a mask having windows at the portions thereof that confront the excitation electrodes on the vibrator element. During actual vibration of the vibrator element in an oscillator, a thin metallic film is vapor deposited on the excitation electrode through the corresponding windows of the mask, thereby to adjust the oscillation frequency to a desired value. Finally, the mask is removed, the vibrator element is covered with a metal cap, and nitrogen is sealed within the space enclosed by the cap.

Problems are encountered in the conventional quartz crystal vibrator described above when the vibrator element is clamped between the clips provided at the ends of the terminal pins. Specifically, it is required that the vibrator element be so positioned as to bring the connecting conductors on both sides thereof into position opposite the clips, and it is required also that the frequency adjusting mask be attached and detached. These operations are laborious and time consuming and therefore not only diminish the efficiency of the assemblage operation but also make it impossible to realize assemblage in a fully automatic manner.

SUMMARY OF THE INVENTION

Accordingly, an object of the present invention is to provide a quartz crystal vibrator in which, when two external terminal pins are to be connected to the periphery of a quartz crystal vibrator element provided with an excitation electrode on each side thereof, one of the external terminal pins can always be connected to one of the excitation electrodes and the other external terminal pin can always be connected to the other excitation electrode, regardless of where the external terminal pins make contact with the periphery of the vibrator elements on the obverse and reverse sides thereof.

Another object of the present invention is to enhance assemblage efficiency by forming a frequency adjustment mask integrally with a supporting base to eliminate the attaching and detaching steps.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3(A) is a perspective view of a quartz crystal vibrator according to the present invention;

FIG. 3(B) is a top view of the quartz crystal vibrator shown in FIG. 3(A);

FIGS. 4 through 7 are plan views of alternate embodiments of electrode patterns according to the present invention;

FIG. 8 is a front view of a holder;

FIG. 9 is a plan view of the holder shown in FIG. 8;

DESCRIPTION OF THE PREFERRED EMBODIMENT

Figure 1A:
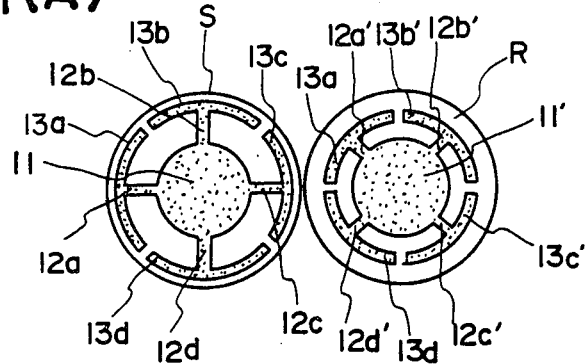
FIG. 1(A) is a split plan view of a quartz crystal vibrator according to the present invention.
Figure 1B:
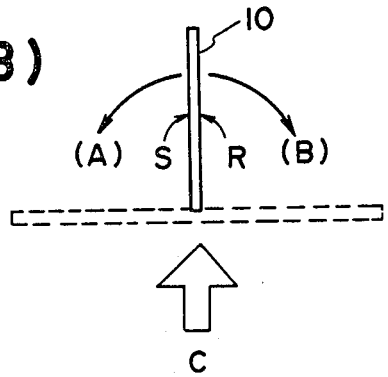
FIG. 1(B) is a side view useful in describing the assembled relationship of the split quartz crystal vibrator shown in FIG. 1(A)

FIG. 1(A) is a split view of the quartz crystal vibrator of the invention when its obverse side S and reverse side R are opened into a plane in the directions A and B shown in FIG. 1(B), when viewed from the direction C. An excitation electrode 11 is formed at the center of the obverse side S. Four connecting electrodes 12a, 12b, 12c, 12d are formed on the obverse side S by leading them out radially from the periphery of the excitation electrode 11. Supporting electrodes 13a, 13b, 13c, 13d are formed separately from one another adjacent the periphery of the quartz crystal 10 on the obverse side S thereof, the supporting electrodes being extended circumferentially to form a circle with each supporting electrode occupying approximately one fourth of the circle. The connecting electrode segment 12a is connected to the supporting electrode 13a. Likewise, the connecting electrode segments 12b, 12c, 12d are connected to the supporting electrodes 13b, 13c, 13d, respectively. An excitation electrode 11' is formed at the center of the reverse side S of the quartz crystal 10 so as to overlap the excitation electrode 11. Four electrodes 12a', 12b', 12c', 12d' are formed on the reverse side of the quartz crystal 10 by leading them out radially from the periphery of the excitation electrode 11', and they are arranged so as not to overlap the connecting electrode segments 12a through 12d on the obverse S of the quartz crystal. Supporting electrodes 13a', 13b', 13c', 13d' are formed separately from one another on the reverse side R of the quartz crystal at positions slightly inward of the crystal periphery, the supporting electrodes being extended circumferentially to define a circle with each supporting electrode occupying approximately one fourth of the circle. Thus the supporting electrodes 13a' through 13d' are so arranged as not to overlap the supporting electrodes 13a through 13d. The connecting electrode segment 12a' is connected to the supporting electrode 13a'. Likewise, the connecting electrode segments 12b', 12c', 12d' are connected to the supporting electrodes 13b', 13c', 13d', respectively.

Figure 2:
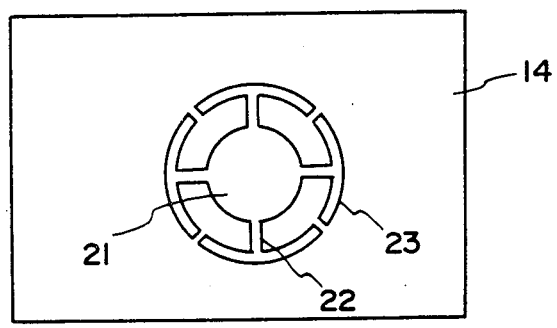
FIG. 2 is a plan view of a mask.

The excitation electrodes 11, 11', connecting electrode segments 12a through 12d and 12a' through 12d', and supporting electrodes 13a through 13d and 13a' through 13d', are formed on the respective obverse and reverse sides of the quartz crystal as follows. First, as shown in FIG. 2, there are prepared, for the obverse and reverse sides of the quartz crystal, two masks 14 having an opening 21 for forming an excitation electrode, an opening 22 for forming a connecting electrode segment, and an opening 23 for forming a supporting electrode. Next, the two masks are so disposed as to overlap the quartz crystal on either side thereof. This is followed by vapor-depositing a thin film of aluminum onto both sides of the quartz crystal through the openings in the mask to form the above-mentioned electrodes on both sides of the quartz crystal at one time.

The quartz crystal vibrator element having the foregoing construction is connected to external terminal pins in the manner shown in FIG. 3. In (A) of FIG. 3, one end of an external terminal pin 112a is situated at any point in the circumference of the quartz crystal vibrator on the obverse side thereof and is brought into contact with the supporting electrode, for example supporting electrode 13c, located at this point. The tip of the external terminal pin 112a is secured to the supporting electrode 13a by an electrically conductive adhesive. This establishes an electrical connection between the external terminal pin 112a and the excitation electrode 11, and affixes the external terminal pin 112a to the quartz crystal vibrator element. Similarly, one end of the other external terminal pin 112b is situated at any point on a supporting electrode provided on the reverse side R of the quartz crystal vibrator and is secured thereto by an electrically conductive adhesive to establish electrical contact between the external terminal pin 112b and the excitation electrode 11', and to affix the external terminal pin 112b to the quartz crystal vibrator element. To affix the quartz crystal vibrator element to a base 4, the quartz crystal element 10 is attached to the base at an angle with respect to a line connecting the external terminal pins 112a and 112b, as shown in (B) of FIG. 3. As described below with respect to FIGS. 8-12, supporting electrodes are then affixed to the external terminal pins 112a, 112b with an electrically conductive adhesive which is applied through windows 115a, 115b (FIG. 11) provided in an adjustment mask 113, after positioning of the quartz crystal 10.

FIGS. 4 through 7 illustrates alternative embodiments of the conductive layer patterns formed on the quartz crystal element. It will be apparent from each of these drawings that there is no overlapping between the electrode segments 12 led out from the excitation electrode 11 on the obverse side and the electrode segments led out from the excitation electrode 11' on the reverse side, and no overlapping between the supporting electrodes 13 on the obverse side and the supporting electrodes on the reverse side. The stray capacitance of the quartz crystal vibrator thus is made as small as possible. In the embodiment of FIG. 7, the arrangement is such that the end portions of each supporting electrode 13 are formed obliquely so that adjacent end portions appear to overlap each other when viewed from the center of the excitation electrode 11.

Described next will be an embodiment wherein a quartz crystal vibrator element of the foregoing type is received in a quartz crystal vibrator holder having a mask for fine frequency adjustment.

FIG. 8 is a front view of the quartz crystal vibrator holder FIG. 8, and FIG. 9 a plan view of the same holder. A supporting base 111 made of a synthetic resin or the like includes implanted external terminal pins 112a, 112b which serve also as members for supporting the quartz crystal element. An adjustment mask 113 is provided on the upper portion of the supporting base 111 by being integrally molded together therewith. Provided in both sides of the adjustment mask 113, at approximately the central portion thereof, are adjustment windows 114 (one of which is not shown). Further, provided on both sides of the adjustment mask 113 at positions confronting the external contact pins 112a, 112b are windows 115a, 115b (the others of which are not shown). The adjustment mask 113 defines a cylindrical cavity which is open at the top portion thereof. Numeral 116 denotes a member provided on the supporting base 111 for positioning the quartz crystal element, the positioning member 116 having a guide groove 117 as depicted in FIG. 9. Positioning members 118a, 118b are provided on the inner surface of the side of the adjustment mask 113 and are in turn provided with guide grooves 119a, 119b.

Figure 10:
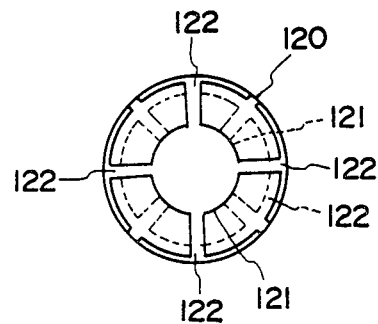
FIG. 10 is a front view of a quartz crystal vibrator element.

FIG. 10 is a front view of an enlargement of a quartz crystal vibrator element 120 similar to that shown in FIG. 1. It will be obvious from the drawing that both sides of the quartz crystal vibrator element 120 are provided with excitation electrodes 121 (one of which is not shown), consisting of silver or aluminum or the like, by means of a vapor deposition technique, as well as with supporting electrodes 122 formed by a vapor deposition technique so as to surround the excitation electrodes 121 and connect with them. It should be noted that the supporting electrodes 122 are provided to cover almost the entire circumference so as to allow any position to be employed as a mounting position.

Figure 11:
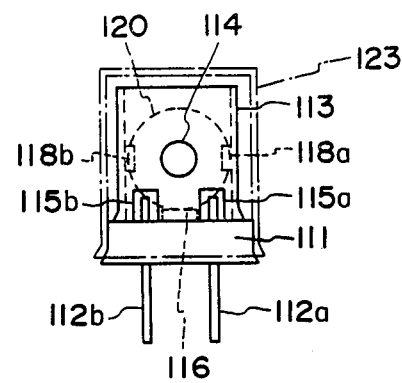
FIG. 11 is a front view of the quartz crystal vibrator element of FIG. 10 in the mounted state.
Figure 12:
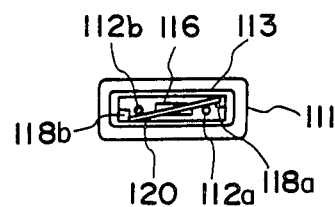
FIG. 12 is a plan view of the mounted quartz crystal vibrator element of FIG. 11.

To attach the quartz crystal vibrator element 120 to the holder, the vibrator 120 is positioned in the opening at the top of the adjustment mask and is inserted along the guide grooves 119a, 119b of the positioning members 118a, 118b until it comes to rest in position on the guide groove 117 of the positioning member 116. The supporting electrodes 122 are then affixed to the external terminal pins 112a, 112b with an electrically conductive adhesive which is applied through the windows 115a, 115b provided in the adjustment mask 113. This completes the mounting operation. FIGS. 11 and 12 are a front view and a plan view, respectively, of the vibrator in the mounted state.

The frequency of the mounted quartz crystal vibrator 120 can be adjusted as follows. The holder is disposed in a vacuum metallizer, and a deposition material of the same kind as the excitation electrodes 121 is vacuum deposited on the excitation electrodes 121 of the quartz crystal vibrator 120 through the adjustment windows 114. This provides a completed quartz crystal vibrator of a desired frequency. Following the above step a metal cap 123 for covering the adjustment mask 113 is fit over the supporting base 111 to protect the assembly.

In accordance with the present invention as described hereinabove, one external terminal pin can be brought into contact with a supporting electrode at any position thereon, the supporting electrode being provided fragmentarily about substantially the entire circumference of the quartz crystal vibrator element on the obverse side thereof, and the other external terminal pin can be brought into contact with a supporting electrode at any position thereon, this supporting electrode being provided fragmentarily over substantially an entire location disposed inwardly of the circumference of the quartz crystal vibrator element on the reverse side thereof. This eliminates the disadvantage encountered in the prior art, namely the difficulty involved in positioning the quartz crystal vibrator element and in connecting the lead wires to the supporting electrodes, and makes it possible to assemble the vibrator fully automatically. Furthermore, since it is so arranged that the connecting electrode segments and supporting electrodes formed on the obverse side of the quartz crystal do not overlap the connecting electrode segments and supporting electrodes formed on the reverse side of the quartz crystal, stray capacitance of the quartz crystal vibrator is reduced, and unnecessary vibratory portions of the quartz crystal are diminished as well, so that there is little spurious vibration. Since the supporting base is integrally molded together with the cavity-defining adjustment mask provided with the frequency adjustment windows and with the windows for affixing the quartz crystal vibrator to the terminal pins, fine adjustment of the quartz crystal vibrator frequency can be accomplished without requiring attachment and detachment of the adjustment mask as in the prior art. This greatly enhances working efficiency.

As many apparently widely different embodiments of the present invention can be made without departing from the spirit and scope thereof, it is to be understood that the invention is not limited to the specific embodiments thereof except as defined in the appended claims.

What we claim is:

1. A quartz crystal vibrator comprising:
   a quartz crystal plate having a circumference and having obverse and reverse sides, each of said obverse and reverse sides having a central portion;
   a first excitation electrode provided on the obverse side of said quartz crystal plate at the central portion thereof;
   a first connecting electrode led out radially from said first excitation electrode on said obverse side;
   a first supporting electrode, connected to said first connecting electrode, provided fragmentarily along the entire circumference of said quartz crystal plate on the obverse side thereof;
   a second excitation electrode provided on the reverse side of said quartz crystal plate at the central portion thereof at a position underlying said first excitation electrode;
   a second connecting electrode led out radially from said second excitation electrode on said reverse side; and
   a second supporting electrode, connected to said second connecting electrode, provided fragmentarily over substantially all of a substantially circular ring-like region located inwardly of the circumference of said quartz crystal plate on said reverse side, so as not to overlap said first supporting electrode.

2. A quartz crystal vibrator according to claim 1, wherein said first and second connecting electrodes are so arranged on said obverse and reverse sides as not to overlap each other.

3. A quartz crystal vibrator according to claim 1, further comprising:
   a supporting base having first and second terminal pins connected to said first and second supporting electrodes, respectively; and
   a hollow, frequency adjustment mask formed integrally with said supporting base, said frequency adjustment mask having a first window for adjusting the frequency of said quartz crystal vibrator, and second windows for affixing said first and second supporting electrodes to said first and second terminal pins.

4. A quartz crystal vibrator according to claim 3, wherein said frequency adjustment mask includes positioning means for retaining said quartz crystal plate in position.

5. A quartz crystal vibrator according to claim 3, wherein said frequency adjustment mask includes means for retaining both side edges and the bottom edge of said quartz crystal plate in position.

6. A quartz crystal vibrator comprising:
   a quartz crystal vibrator element including:
      a quartz crystal plate having a circumference and having obverse and reverse sides, each of said obverse and reverse sides having a central portion;
      a first excitation electrode provided on the obverse side of said quartz crystal plate at the central portion thereof;
      a first connecting electrode led out radially from said first excitation electrode on said obverse side;
      a first supporting electrode, connected to said first connecting electrode, provided fragmentarily along the entire circumference of said quartz crystal plate on the obverse side thereof;
      a second excitation electrode provided on the reverse side of said quartz crystal plate at the central portion thereof at a position underlying said first excitation electrode;
      a second connecting electrode led out radially from said second excitation electrode on said reverse side; and
      a second supporting electrode, connected to said second connecting electrode, provided fragmentarily over substantially all of a substantially circular ring-like region located inwardly of the circumference of said quartz crystal plate on said reverse side, so as not to overlap said first supporting electrode; and
   a holder for holding said quartz crystal vibrator element, including:
      a supporting base having two terminal pins for connection to said quartz crystal vibrator element; and
      a hollow, frequency adjustment mask formed integrally with said supporting base, said frequency adjustment mask having a first window for adjusting the frequency of said quartz crystal vibrator element, and second windows for affixing said quartz crystal vibrator element to said two terminal pins;

said first and second supporting electrodes of said quartz crystal vibrator element being connected to respective ones of said two terminal pins after said quartz crystal vibrator element is inserted into said hollow, frequency adjustment mask of said holder.

7. A quartz crystal vibrator according to claim 6, wherein said frequency adjustment mask includes positioning means for retaining said quartz crystal vibrator element in position.

8. A quartz crystal vibrator according to claim 6, wherein said frequency adjustment mask includes means for retaining both side edges and the bottom edge of said quartz crystal vibrator element in position.

9. A quartz crystal vibrator comprising:
- a substantially circular quartz crystal plate having a circumference and having obverse and reverse sides, each of said obverse and reverse sides having a central portion;
- a first excitation electrode formed on the central portion of the obverse side of said quartz crystal plate;
- first connecting electrodes extending radially from said first excitation electrode on said obverse side;
- first supporting electrodes, respectively connected to and extending from said first connecting electrodes, said first supporting electrodes formed along the circumference of the obverse side of said quartz crystal plate with intermittent spaces being provided between adjacent ones of said first supporting electrodes along the circumference;
- a second excitation electrode formed on the central portion of the reverse side of said quartz crystal plate so that said first and second excitation electrodes overlap substantially the same portion of said quartz crystal plate;
- second connecting electrodes extending radially from said second excitation electrode on said reverse side of said quartz crystal plate; and
- second supporting electrodes, respectively connected to and extending from said second connecting electrodes, said second supporting electrodes forming a substantially circular ring-like region on said reverse side between said second connecting electrodes and a circle on said quartz crystal plate having a circumference which is less than the circumference of said quartz crystal plate, so that said first supporting electrodes and said second supporting electrodes do not overlap the same portion on opposite sides of said quartz crystal plate.

10. A quartz crystal vibrator according to claim 9, wherein said first connecting electrodes and said second connecting electrodes are formed so as not to overlap the same portions on opposite sides of said quartz crystal plate.

11. A quartz crystal vibrator according to claim 1, further comprising:
- a supporting base having first and second terminal pins connected to one of said first supporting electrodes and one of said second supporting electrodes, respectively; and
- a hollow, frequency adjustment mask formed integrally with said supporting base, said frequency adjustment mask having a first window for adjusting the frequency of said quartz crystal vibrator, and second windows for use in affixing said one of said first supporting electrodes of said one of said second supporting electrodes to said first and second terminal pins, respectively.

12. A quartz crystal vibrator according to claim 11, wherein said frequency adjustment mask includes means for retaining said quartz crystal plate in position.

13. A quartz crystal vibrator according to claim 11, wherein said frequency adjustment mask includes means for retaining both the side edges and the bottom edge of said quartz crystal vibrator plate in position.

* * * * *

UNITED STATES PATENT AND TRADEMARK OFFICE
CERTIFICATE OF CORRECTION

PATENT NO. : 4,439,706
DATED : MARCH 27, 1984
INVENTOR(S) : YOUICHI MATSUOKA ET AL.

It is certified that error appears in the above-identified patent and that said Letters Patent is hereby corrected as shown below:

```
FRONT PAGE [30] Foreign Application Priority Data,
                "Oct. 11, 1980" should be --Nov. 10, 1980--;

]57] ABSTRACT
                line 1, "a vibrator" should be --a quartz
                        crystal vibrator--.

Col. 2, line 46, after "split" insert --plan--.

Col. 3, line 39, "example" should be --example,--.
```

Signed and Sealed this

Ninth Day of October 1984

[SEAL]

Attest:

Attesting Officer

GERALD J. MOSSINGHOFF

Commissioner of Patents and Trademarks